United States Patent Office 3,748,134

Patented July 24, 1973

3,748,134

TREATMENT OF FROSTABLE LIGHT SENSITIVE ORGANIC LAYERS WITH WATER VAPOR, AFTER EXPOSURE, FOR OBTAINING FROSTED IMAGES IN UNEXPOSED AREAS

Rexford W. Jones and William B. Thompson, Columbus Ohio, assignors to A. E. Staley Manufacturing Company, Decatur, Ill.

No Drawing. Continuation-in-part of application Ser. No. 796,897, Feb. 5, 1969. This application Mar. 10, 1971, Ser. No. 123,086

Int. Cl. G03c 5/24, 1/72

U.S. Cl. 96—48 HD 6 Claims

ABSTRACT OF THE DISCLOSURE

Frost patterns are produced by exposing a frostable light-sensiitve organic layer, comprising a film-forming frostable organic material, to actinic radiation in image-receiving manner to form a latent image and producing a frost image in the unexposed areas by contacting the exposed layer with water vapor.

DISCLOSURE OF INVENTION

This application is a continuation-in-part of application, Ser. No. 796,897, filed Feb. 5, 1969 and now abandoned.

This invention relates to a new method of producing frost patterns. More particularly, this invention relates to a method of producing frost patterns by exposing a film-forming frostable layer to actinic radiation to form a latent image and contacting the exposed layer with aqueous vapors to produce a frost pattern in the exposed areas.

In U.S. Pat. 3,196,011 of Gunther et al., there is disclosed a method of producing frost patterns. In simplified form, this process comprises charging a photoconductive element comprising at least one layer which is capable of frosting, exposing the element to actinic radiation in image-wise configuration and softening the frostable layer with heat and/or solvent vapors to produce a milky white, so-called frost pattern, in the areas exposed to actinic radiation. This process has the obvious disadvantage that it requires the use of a light-sensitive element comprising a photoconductive layer, and the use of an electrostatic charging means. Further, the techniques described in Gunther et al. are suitable for the production of milky or frost patterns corresponding to the light exposed areas, i.e. the light-sensitive element is negative-acting.

The general object of this invention is to provide a new method of producing frost patterns. A second object of this invention is to provide a method of producing frost patterns without employing a photoconductive element or an electrostatic charging step. Another object of this invention is to provide a method of producing frost patterns with a positive-acting light-sensitive material, i.e. the frost pattern appears in the areas exposed to light. Other objects will appear hereinafter.

The object of this invention can be attained by exposing layers comprising the frostable layers described by Gunther et al. to actinic radiation to form a latent image and contacting the exposed element with water vapor. In this case, milky areas appear only in the light exposed areas in contrast to the Gunther et al. technique. The resultant imaged elements can be utilized in the same manner as the elements produced by the methods of Gunther et al.

Suitable light-sensitive frostable film-forming organic materials useful in this invention include internally ethylenically unsaturated acids, such as abietic acid, rosin acids, partially hydrogenated rosin acids, such as those sold under the name of Staybelite resin, wood rosin, etc.; esters of internally ethylenically unsatuarted acids, such as partially hydrogenated rosin acid esters (e.g. those sold under the name Staybelite esters); coal tar resins, such as coumarone-indene resins; polymers of ethylenically unsatuarted monomers, such as vinyltoluene-alpha methyl styrene copolymers, styrene homopolymers; halogenated hydrocarbons, such as chlorinated waxes, chlorinated polyethylene, etc. Various other materials suitable for use in frost imaging are described in U.S. Pat. 3,196,011.

Generally it is preferred to compound the film-forming frostable organic material with photoactivator(s) to impart optimum light-sensitivity to the frostable layer. In most cases, the light-sensitivity of the layer can be increased manyfold by incorporation of a suitable photoactivator capable of producing free radicals which catalyze the light-sensitive reaction and reduce the number of photons necessary to yield the desired physical change during subsequent treatment with water vapor.

Suitable photoactivators capable of producing free radicals include benzil, benzoin, Michlers ketone, diacetyl, phenanthraquinone, p-dimethylaminobenzoin, 7,8-benzoflavone, trinitrofluorenone, desoxybenzoin, 2,3-pentanedione, dibenzylketone, nitroisatin, di(6-dimethylamino-3-pyridyl) methane, metal naphthenates, N-methyl-N-phenylbenzylamine, pyridyl, 5,7 dichloroisatin, azodiisobutyronitrile, trinitroanisole, chlorophyll, isatin, bromoisatin, etc. These compounds can be used in a concentration of .001 to 2 times the weight of the film-forming organic material (.1%–200% the weight of film-former). As in most catalytic systems, the best photoactivator and optimum concentration thereof is dependent upon the film-forming organic material. Some photoactivators respond better with one type of film former and may be useful over rather narrow concentration ranges whereas others are useful with substantially all film-formers in wide concentration ranges.

The acyloin and vicinal diketone photoactivators, particularly benzil and benzoin, are preferred. Benzoin and benzil are effective over wide concentration ranges with substantially all film-forming light-sensitive organic materials. Further, these materials have the additional advantage that they have a plasticizing or softening effect on the film-forming light-sensitive layers, thereby enhancing the frostable character of the light-sensitive layer.

Dyes, optical brighteners and light absorbers can be used alone or preferably in conjunction with the aforesaid free-radical producing photo-activators (primary photoactivators) to increase the light-sensitivity of the light-sensitive layers of this invention by converting the light rays into light rays of longer wave lengths. For convenience, these secondary photoactivators (dyes, optical brighteners and light absorbers) are called "superphotoactivators." Suitable dyes, optical brighteners and light absorbers include 4-methyl-7-dimethylaminocoumarin, Calcofluor yellow HEB (preparation described in U.S. Pat. 2,415,373), Calcofluor white SB super 30080, Calcofluor, Uvitex W conc., Uvitex TXS conc. Uvitex RS (described in Textil-Rundschau 8 (1953), 339), Uvitex WGS conc., Rundschau 8, (1953), 340), Aclarat 8678, Blancophor OS, Tenopol UNPL, MDAC S–8844, Uvinul 400, thioflavine TGN conc., aniline yellow-S (low conc.), Setoflavine T 5506–140, Auramine O, Calcozine Yellow OX, Calcofluor RW, Calcofluor GAC, Acetosol yellow 2 RLS–PHF, eosine bluish, Chinoline yellow - P conc., Ceniline yellow S (high conc.), anthracene blue violet fluorescence, Calcofluor white MR, Tenopol PCR, Uvitex GS, acid-yellow-T-supra, Acetosol yellow 5 GLS, Calcocid Or. Y. Ex. Conc., diphenyl brilliant flavine 7 GFF, Resoform fluorscent yel, 3 GPI, eosin yellowish thiazole Fluorescor G, Pyrazolone orange YB–3 and National FD&C yellow. Individual superphotoactivators may respond better with one type of light-sensitive organic film-former and photoactivator than with others. Further, some photoactivators function better with certain classes of brighteners, dyes and light absorbers. For the most part, the most advantageous combinations of these mtaerials and proportions can be determined by simple experimentation.

Typically, light-sensitive layers of the type described above, when compounded with suitable photoactivators, preferably acyloins or vicinal diketones together with superphotoactivators, require less than 2 minutes exposure to convert the light-sensitive element to a frostable condition, i.e. substantially destroy the ability of the exposed areas to deform or turn milky upon the subsequent application of water vapor.

The light-sensitive elements useful in this invention are prepared by applying a thin layer of solid, light-sensitive film-forming organic material to a suitable substrate by any suitable means dictated by the nature of the material (hot-melt draw down, spray, roller coating or air knife, flow, dip or whirler coating from solvent solution, curtain coating, etc.) so as to produce a reasonably smooth homogeneous layer of from about 0.01 micron to in excess of about 100 microns. Generally, light-sensitive layers of about 0.4 to 10 microns are preferable.

The preferred method of forming light-sensitive elements of predetermined thickness entails flow-coating a solution (such as hexane, heptane, benzene, etc.; halogenated hydrocarbons, such as chloroform, carbon tetrachloride, 1,1,1-trichloroethane, trichloroethylene, etc.) of the light-sensitive organic film-former alone or together with dissolved or suspended photoactivators onto the substrate. Typically, the solution dries in air to a continuous clear film in less than one minute.

The substrates for the light-sensitive elements should be smooth and uniform in order to facilitate obtaining a smooth coating. Transparent supports are preferred for the preparation of slides suitable for viewing using schlieren optics. However, various opaque or colored supports can be utilized. In some cases, it is desirable to apply a hydrophilic subbing layer to the substrates, particularly paper substrates. The hydrophilic subbing layer slows down the penetration of organic solvent solutions and, other things being equal, permits the formation of thicker light-sensitive layers. Suitable hydrophilic layers include polyvinyl alcohol, hardened gelatin, polyvinyl pyrrolidone, amylose, polyacrylic acid, etc.

A latent image is formed in the light-sensitive elements of this invention by exposing the element to actinic radiation in image-receiving manner for a time sufficient to substantially destroy the frostable characteristics of the light-sensitive layer. The light-sensitive elements can be exposed to actinic radiation through a photographic positive or negative which may be line, half-tone or continuous tone, etc. After the light-sensitive element is exposed to actinic radiation, the latent image is developed by contacting the exposed element with water vapor, preferably steam. In this way, a frost pattern is produced with a positive-acting sensitizer.

The following examples are merely illustrative and should not be construed as limiting the scope of this invention.

Example I

One gram Staybelite Ester #10 (partially hydrogenated ester of glycerol), 0.25 gram benzil and 0.15 gram 4-methyl-7-dimethylaminocoumarin, dissolved in 100 mls. Chlorothene (1,1,1 - trichloroethane), was applied to a glass slide by flow coating the solution over the substrate supported at about a 60° angle with the horizontal. After air drying for approximately one minute, the light-sensitive layer was placed in a vacuum frame in contact with a positive transparency and exposed to a mercury-light point source for about 60 seconds. The exposed light-sensitive element was removed from the vacuum frame and developed by holding the glass slide over boiling water. The unexposed areas of the light-sensitive element became milky white while the exposed areas remained substantially transparent.

Essentially the same results are obtained by replacing the light-sensitive Staybelite Ester #10 composition (partially hydrogenated rosin ester of glycerol) with (a) 1.25 grams Staybelite Ester No. 5 (partially hydrogenated rosin ester of glycerol), .1875 gram benzil and .3125 gram 4-methyl - 7-dimethylaminocoumarin dissolved in 100 mls. Chlorothene (b) 1.25 grams Staybelite resin F (partially hydrogenated rosin acids), .1 gram benzil and .3125 gram 4-methyl-7-dimethylaminocoumarin dissolved in 100 mls. Chloroethene, (c) 1.25 grams wood rosin, .15 gram benzil and .3125 gram 4-methyl-7-dimethylaminocoumarin dissolved in 100 mls. Chloroethene, (d) 1.25 grams abietic acid, .15 gram benzil and .3125 gram 4-methyl-7-dimethylaminocoumarin dissolved in 100 mls. Chlorothene and (e) 1.25 grams Chlorowax 70 LMP, .3 gram benzil and .3125 gram 4-methyl-7-dimethylaminocoumarin dissolved in 100 mls. Chlorothene.

Since many embodiments of this invention may be made and since many changes may be made in the embodiments described, the foregoing is to be interpreted as illustrative only and our invention is defined by the claims appended hereafter.

What is claimed is:

1. The method of producing frost patterns, which comprises exposing a frostable light-sensitive organic layer comprising a film-forming frostable organic material to actinic radiation in image-receiving manner to form a latent image and producing a frost image in the unexposed areas by contacting the exposed layer with water vapor.

2. The process of claim 1, wherein said light-sensitive element comprises at least one photoactivator selected from the group consisting of photoactivators capable of producing free radicals on exposure to actinic radiation and superphotoactivators capable of converting light rays into light rays of longer wave lengths.

3. The process of claim 1, wherein the film-forming organic material comprises an ester of internally ethylenically unsaturated acid.

4. The process of claim 3, wherein said ester is a partially hydrogenated rosin ester.

5. The process of claim 1, wherein said light-sensitive film-former comprises an internally ethylenically unsaturated acid.

6. The process of claim 5, wherein the internally ethylenically unsaturated acid comprises a partially hydrogenated rosin acid.

References Cited

UNITED STATES PATENTS 3,196,011 7/1965 Gunther et al. -------- 96—1.1
3,512,970 5/1970 Millard ------------- 96—35.1

OTHER REFERENCES

The Focal Encyclopedia Desk Edition, reprinted 1969, McGraw-Hill Book Co., N.Y., pp. 1129–1130.

NORMAN G. TORCHIN, Primary Examiner
A. T. SURO PICO, Assistant Examiner

U.S. Cl. X.R.

96—114, 114.1

UNITED STATES PATENT OFFICE

CERTIFICATE OF CORRECTION

Patent No. 3,748,134 Dated July 24, 1973

Inventor(s) Rexford W. Jones and William B. Thompson

It is certified that error appears in the above-identified patent and that said Letters Patent are hereby corrected as shown below:

Column 1, line 17; for "sensiitve" read ---sensitive---
Column 1, line 72; for "unsatuarted" read ---unsaturated---
Column 2, bridging lines 3 and 4; for "unsatuarted" read ---unsaturated---
Column 2, line 24; for "pyridyl" read ---pyradil---
Column 2, bridging lines 58 and 59; for "Uvitex WGS conc., Rundschau 8" read ---Uvitex WGS conc., Uvitex K., Uvitex CF conc., Uvitex W (described in Textil-Rundschau 8---
Column 2, line 68; for "eosin" read ---eosine---
Column 3, line 4; for "mtaerials" read ---materials---

Signed and sealed this 17th day of September 1974.

(SEAL)
Attest:

McCOY M. GIBSON JR.
Attesting Officer

C. MARSHALL DANN
Commissioner of Patents